US006819822B2

(12) United States Patent
Behin et al.

(10) Patent No.: US 6,819,822 B2
(45) Date of Patent: Nov. 16, 2004

(54) TWO-DIMENSIONAL GIMBALED SCANNING ACTUATOR WITH VERTICAL ELECTROSTATIC COMB-DRIVE FOR ACTUATION AND/OR SENSING

(75) Inventors: Behrang Behin, Berkeley, CA (US); Michael J. Daneman, Pacifica, CA (US); Meng-Hsiung Kiang, Berkeley, CA (US); Kam-Yin Lau, Danville, CA (US); Satinderpall Pannu, Berkeley, CA (US)

(73) Assignee: Analog Devices, Inc., Norwood, MA (US)

( * ) Notice: Subject to any disclaimer, the term of this patent is extended or adjusted under 35 U.S.C. 154(b) by 245 days.

(21) Appl. No.: 09/751,660

(22) Filed: Dec. 28, 2000

(65) Prior Publication Data

US 2001/0048784 A1 Dec. 6, 2001

Related U.S. Application Data

(60) Provisional application No. 60/191,987, filed on Mar. 24, 2000, provisional application No. 60/191,856, filed on Mar. 24, 2000, and provisional application No. 60/192,097, filed on Mar. 24, 2000.

(51) Int. Cl.[7] .......................... G02B 6/35; G02B 26/10; G02B 26/08
(52) U.S. Cl. .................... 385/18; 359/223; 359/224; 359/226
(58) Field of Search .............. 385/16, 18; 359/196–199, 359/223, 224, 226

(56) References Cited

U.S. PATENT DOCUMENTS

| 5,648,618 A | 7/1997 | Neukermans et al. ..... 73/862.08 |
| 5,723,353 A | 3/1998 | Muenzel et al. ............... 437/51 |
| 5,726,073 A * | 3/1998 | Zhang et al. .................. 438/20 |
| 5,753,911 A | 5/1998 | Yasuda et al. ............... 250/306 |

(List continued on next page.)

FOREIGN PATENT DOCUMENTS

| DE | 296118818 | 12/1996 | ............ G02B/6/35 |
| DE | 19757181 A | 7/1997 | ............ G02B/6/35 |
| DE | 19644918 A | 4/1998 | ............ G02B/6/35 |
| EP | 0907076 A2 | 4/1997 | .......... G01N/27/00 |
| EP | 0911952 A2 | 4/1999 | ............ H02N/1/00 |
| EP | 0911952 A3 | 4/2000 | ............ H02N/1/00 |
| EP | 0907076 A3 | 10/2000 | ............ H01J/37/63 |
| FR | 2732467 A1 | 4/1996 | ........... G01P/15/08 |

OTHER PUBLICATIONS

"A Flat High–Frequency Scanning Micromirror"; Robert A. Conant, Jocelyn T. Nee, Kam Y. Lau and Richard S. Muller; Berkeley Sensor & Actuator Center, University of California, Berkeley.

"Electrostatic Comb Drive For Vertical Actuation" A.P. Lee et al., Proceedings of the SPIE, SPIE, Bellingham, VA, vol. 3224, Sep. 29, 1997, pp 109–119.

(List continued on next page.)

Primary Examiner—Hemang Sanghavi
Assistant Examiner—Omar Rojas
(74) Attorney, Agent, or Firm—JDI Patent; Joshua D. Isenberg

(57) ABSTRACT

A two-dimensional scanner consists of a rotatable gimbal structure with vertical electrostatic comb-drive actuators and sensors. The scanner's two axes of rotation may be controlled independently by activating two sets of vertical comb-drive actuators. The first set of vertical comb-drive actuator is positioned in between a outer frame of the gimbal structure and the base, and the second set of vertical comb-drive actuator is positioned in between the inner part of the gimbal structure and the outer frame of the gimbal structure. The inner part of the gimbal structure may include a reflective surface, and the device may be used as a mirror. Furthermore, the capacitance of the vertical comb-drives may be measured to monitor the angular position of the mirror, and the capacitive position-monitoring signal may be used to implement closed-loop feedback control of the mirror angle. The two-dimensional scanner may be fabricated in a semiconductor process. Two-dimensional scanners may be used to produce fiber-optic switches.

51 Claims, 7 Drawing Sheets

U.S. PATENT DOCUMENTS

| | | | | |
|---|---|---|---|---|
| 5,872,880 | A | | 2/1999 | Maynard ..................... 385/88 |
| 5,881,198 | A | | 3/1999 | Haake ........................ 385/136 |
| 5,959,760 | A | * | 9/1999 | Yamada et al. ............. 359/224 |
| 5,969,848 | A | | 10/1999 | Lee et al. ................... 359/298 |
| 5,995,334 | A | | 11/1999 | Fan et al. ................... 360/106 |
| 5,998,906 | A | | 12/1999 | Jerman et al. .............. 310/309 |
| 6,097,859 | A | * | 8/2000 | Solgaard et al. .............. 385/17 |
| 6,330,102 | B1 | | 12/2001 | Daneman et al. ........... 359/290 |

OTHER PUBLICATIONS

"Design, Fabrication, Position Sensing, And Control Of An Electrostatically–Driven Polysilicon Microactuator," P. Cheung et al, IEEE Transactions on Magnetics, vol. 32, No. 1, Jan. 1, 1996, pp 122–128.

"Optical Methods For Micromachine Monitoring And Feedback" , F.M. Dickey et al., Sensors and Actuators, vol. 78, 1999, pp 220–235.

"A High Sensitivity Z–Axis Capacitive Silicon Microaccelerometer with a Torisional Suspension", Selvakumar et al., Journal of Microelectromechanical Systems, IEEE Inc., New York, vol. 7, No. 2, Jun. 1998, pp 192–200.

"MEMS Fabrication of High Aspect Ratio Track–Following Micro Actuator for Hard Disk Drive Using Silicon On Insulator", B. H. Kim et al., Technical Digest of the IEEE International MEMS '99 Conference. $12^{th}$ IEEE International Conference on Micro Electro Mechanical Systems. Orlando, FL, Jan. 17–21, 1999, IEEE International Micro Electro Mechanical Systems Converence, New York, NY, 1999, pp 53–56.

"Fabrication of Comb–Shaped Microactuator for Multi–Degrees–of–Freedom System", F. Fujikawa et al., Robotics, CIM and Automation, Emerging Technologies, San Diego, Nov. 9–13, 1992, Proceedings of the International Converence on Industrial Electronics, Control, Instrumentation and Automation (IECON), New York, NY, IEEE, US, vol. 2 Conf 18, Nov. 9, 1992, pp 990–995.

"Integrated Micro–Scanning Tunneling Microscope", Xu et al., Applied Physics Letters, American Institute of Physics, New York, vol. 67, No. 16, Oct. 16, 1995 pp 2305–2307.

"Single Crystal Silicon Supported Thin Film Micromirrors for Optical Applications", Z. Yao et al., Optical Engineering Society of Photo–Optical Instrumentation Engineers. Bellingham, WA, vol. 36, No. 5, May 1, 1997, pp 1408–1413.

"Vertical Comb Array MicroActuators", A. Selvakumar et al., Proceedings of the Workshop on Micro Elecrical Mechanical Systems (MEMS), Amsterdam, New York, Jan. 29–Feb. 2, 1995, IEEE vol. Workshop 8 Jan. 29, 1995, pp 43–48 ISBN 0–7803–2504–4.

"Fabrication of a 3D Differential–Capacitive Acceleration Sensor by UV–LIGA", W. Qu et al., Sensors and Actuators 77 (1999), pp 14–20, Elsevier Science, 0924–4247/66/$.

"Integrating SCREAM Micromachined Devices with Integrated Circuits", K.A. Shaw, N.C MacDonald, IEEE MEMS '96, San Diego, California 1996, IEEE Publication 0–7803–2985–6/96, pp 44–48.

"An electrostatically excited 2D–Micro–Scanning–Mirror with an in–plane configuration of the driving electrodes", H. Schenk et al., MEMS 2000, $13^{th}$ Int. Micro Electro Mechanical Systems Conf, Miyazaki, Japan, p. 473–478 (2000).

"Damping of Micro Electrostatic Torsion Mirror Caused by Air–Film Viscosity", N. Uchida et al.

"Single Crystal Silicon (SCS) MicroMirror Arrays using Deep Silicon Etching and IR Alignment", C.S.B. Lee et al.

U.S. patent application Ser. No. 09/584,835 entitled "Staggered Torsional Electrostatic Combdrive and Method of Forming Same" by Robert A. Conant, Jocelyn T. Nee, Kam–Yin Lau and Richard S. Muller, filed May 31, 2000.

Fedder et al., "Multimode Digital Control of a Suspended Polyslicon Microstructure", IEEE Journal of Microelectromechanical Systems, vol. 5, No. 4, Dec. 1996, pp 283–297.

Cheung et al., "Design, Fabrication, Position Sensing, and Control of an Electrostatically–driven Polysilicon Microactuator", IEEE Transaction of Magnetics, vol. 32, No. 1, Jan. 1996, pp 122–128.

Yun et al., "Surface Micromachined, Digitally Forced–Balanced Accelerometer with Integrated CMOS Detection Circuitry", Tech. Digest IEEE Solid–State Sensor and Actuator Workshop, Jun. 1992 pp 126–131.

* cited by examiner

Starting substrate

Trench formation

Trench fill with etch-stop material

Selective exposure of device layer

Formation of top comb fingers

Isotropic release etch

Formation of backside cavity

Final release

TWO-DIMENSIONAL GIMBALED SCANNING ACTUATOR WITH VERTICAL ELECTROSTATIC COMB-DRIVE FOR ACTUATION AND/OR SENSING

CROSS REFERENCE TO RELATED APPLICATIONS

This application is a related to the following copending U.S. provisional applications, which are herein incorporated by reference: Provisional Application 60/191,987 "Two-Dimensional Scanning Actuator with Vertical Electrostatic Comb Drive Actuation and/or Sensing" of Behrang Behin, Michael J. Daneman, Meng H. Kiang, Kam Y. Lau, and Satinderpall Pannu; Provisional Application 60/191,856, "Self-Aligned Comb-Drive Actuators" of Behrang Behin and Satinderpall Pannu; Provisional Application 60/192,097 "Multi-Layer, Self-Aligned Vertical Comb-Drive Electrostatic Actuators and Fabrication Methods" of Behrang Behin and Satinderpall Pannu.

FIELD OF THE INVENTION

This invention relates generally to microactuators. More particularly, it relates to two-dimensional gimbaled scanning actuators with vertical comb-drives for actuation and/or sensing.

BACKGROUND ART

Microelectromechanical system (MEMS) fabricated using silicon integrated circuit processing techniques have been developed for a wide variety of applications that require actuation and/or sensing of microstructures. The electrostatic comb-drive structure has become an integrated component in many of these MEMS device. A vertical comb-drive device can be used to generate an actuating force on a suspended structure as a bias voltage is applied. This force can be used to actuate microstructures out of the plane in which they were made.

Electrostatically actuated gimbaled two-dimensional actuators have previously employed an electrostatic gap-actuator design shown in FIG. 1. As shown in FIG. 1, a gimbaled electrostatic-gap actuator 100 consists of a base 102, an outer frame 104, and an inner part 108. The outer frame 104 is attached to a base 102 by a first pair of torsional flexures 106. The inner part 108 is attached to the outer frame 104 by a second pair of torsional flexures 110 positioned at a perpendicular angle relative to the first pair of torsional flexures 106. The gimbaled electrostatic-gap actuator 100 is suspended over a set of electrodes 112, and the angle of the gimbaled electrostatic-gap actuator 100 is adjusted by applying a voltage difference between the electrodes 112 and the suspended actuator 100. The gimbaled electrostatic-gap actuator requires a high voltage to achieve a significant angular deflection. Furthermore, the angle versus applied voltage characteristics of this structure are very nonlinear because the gap between the electrodes 112 and the suspended actuator 100 changes as the angle of the actuator is varied, and the electrostatic force between the electrodes 112 and the suspended actuator 100 has a non-linear dependence on the gap. In fact, gap-closing actuators with linear restoring springs typically have a 'snap-in' instability point at approximately one-third of the full range of motion of the actuator. In addition, the two perpendicular axes of rotation can not be independently controlled since adjusting one axis changes the electrostatic gap associated with the other. This cross-axis dependence makes control of such structures difficult.

In the electrostatic gap-actuator structure of the prior art, the capacitance between the electrodes 112 and the suspended actuator 100 can be measured in order to monitor the position of the actuator. However, since the gap between the electrodes 112 and the suspended actuator 100 must be fairly large in order to allow for a large angular deflection, this capacitance is very small, and the accuracy of the capacitive measurement is very poor.

Vertical electrostatic comb-drive actuators have been employed to make one-dimensional rotational scanners. Electrostatic comb-drive actuators allow for exertion of a greater force over a large range by increasing the effective overall capacitive gap area. Furthermore, they allow for a more linear angle versus applied voltage relationship since the capacitive overlap area between the opposing electrodes depends almost linearly on the angle of the actuator, and the gap between the opposing electrodes remains fairly constant over the entire actuation range. Vertical electrostatic comb-drive actuators, which are shown in FIGS. 2A–B, have been used to produce one dimensional rotating mirror structures with significantly lower actuation voltages than required for electrostatic gap actuators as described in FIG. 1. FIG. 2A is a plan view of one-dimensional vertical comb-drive actuator 200 without applied voltage. The device 200 includes a base 202 and a mirror 204 attached to the base 202 by a pair of torsional flexures 206. Two vertical electrostatical comb-drive actuators containing movable comb fingers 208 and fixed comb fingers 210 are fixed to the base 202 and the mirror 204 such that the degree of engagement, or the overlap area, between the interdigitated comb fingers depends on the angle between the base 202 and the mirror 204. FIG. 2B is a plan view of the device illustrated in FIG. 2A with an applied voltage. As shown in FIG. 2B, applying a voltage to the actuators attracts the moving comb fingers 208 to the fixed comb fingers 210, which exert a torque on the mirror 204 and cause the mirror 204 to rotate about an axis 212.

The capacitive coupling between the moving comb fingers 208 and the stationary comb fingers 210 can be measured in order to monitor the angle of the mirror 204. Since the capacitance is fairly large, known methods can be employed to measure the capacitance with a high degree of accuracy. Similarly, comb-drives can be used for capacitive sensing only in a one-dimensional rotational actuator that employs another method of actuation (i.e. electrostatic gap-closing, magnetic).

U.S. Pat. No. 5,648,618 issued Jul. 15, 1997 to Neukermans et al., discloses a micromachined gimbaled actuator. An outer silicon frame oscillates around a first pair of bar shaped hinges by electrostatic or magnetic force. One end of each hinge of the first pair of hinges attaches to an inner frame, which attaches to a fixed inner post by a second pair of bar shaped torsion hinges positioned at right angles to the first set of hinges. The first and second pairs of bar shaped torsion hinges are made of single crystal silicon. First and second four-point piezoresistive strain sensors are built in the first and second pair of hinges for measuring the torsion displacement of the hinges. This apparatus does not posses several of the advantages gained by using comb-drive actuators and sensors, including linear behavior, low-voltage operation, and integration of the actuator and sensor in one structure. Furthermore, previous gimbaled structures have only employed lateral comb-drive actuators for in-plane motion.

There is a need, therefore, for an improved two-dimensional gimbaled scanner with out-of-plane rotational motion that provides linear drive and sense capabilities, low-voltage operation, and potential integration of the drive and sense mechanisms.

OBJECTS AND ADVANTAGES

Accordingly, it is a primary object of the present invention to provide a gimbaled two-dimensional scanner, which contains vertical comb-drives that are used for actuation, for sensing, or for both actuation and sensing.

It is a further object of the present invention to provide a gimbaled two-dimensional scanner with vertical comb-drive actuators, which has two independently controlled axes of rotation.

SUMMARY

These objects and advantages are attained by two-dimensional scanners containing vertical comb-drive actuators.

A two-dimensional scanner according to a preferred embodiment of the present invention consists of a rotatable gimbal structure containing a base, an outer frame, and an inner part. The outer frame is attached to the base by a first pair of torsional flexures that allow the outer frame to rotate about a first axis. The inner part is attached to the outer frame by a second pair of torsional flexures that allow the inner part rotate about a second axis. The inner part may include a reflective surface such as a mirror. The scanner further includes one or more vertical electrostatic comb-drive actuators positioned between the outer frame and the base, and between the inner part and the outer frame. Voltages are applied to the comb-drive actuators to allow the inner part to rotate about two axes. The voltages across the two pairs of comb-drives are adjusted to control the angle between the outer frame and the base, and angle between the inner part and the outer frame. Since the capacitance of the comb-drives depends on the degree to which they are engaged, the capacitance is measured to sense the angular positions of the inner part and the outer frame. The capacitive angle signals are used in servo loops to actively control the positions of the inner part and the outer frame.

Two-dimensional scanners having features in common with the two-dimensional scanner as described in above embodiment are used to produce fiber-optic switches that switch light between optical fibers.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 3:
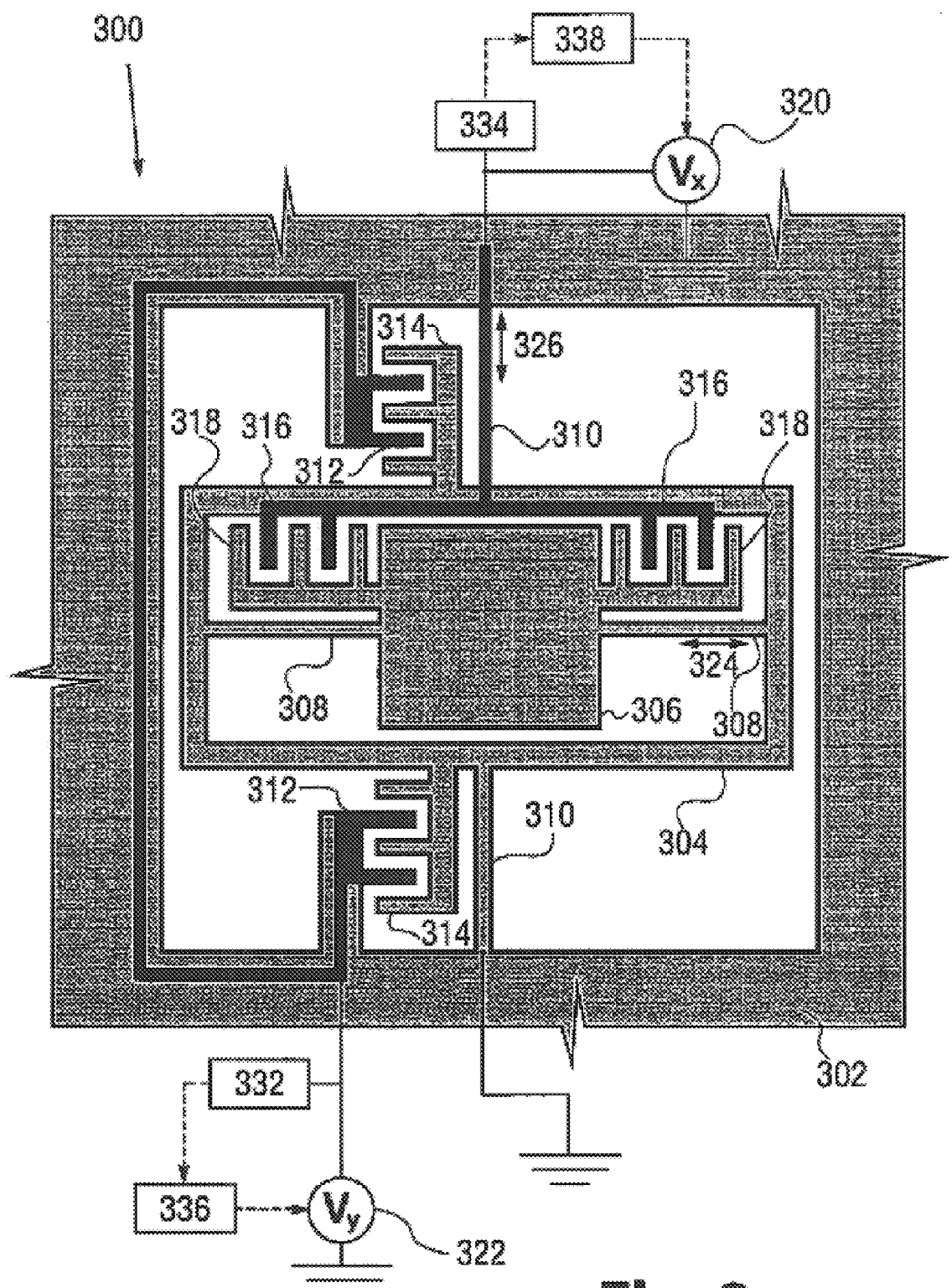
FIG. 3 is a plan view of a gimbaled two-dimensional scanner with vertical comb-drive actuators according to a preferred embodiment of the present invention.

A gimbaled two-dimensional scanner with vertical electrostatic comb-drive actuators for rotational actuation and/or sensing is shown in FIG. 3 according to a preferred embodiment of the present invention. As shown in FIG. 3, two-dimensional scanner 300 includes a base 302, an outer frame 304 attached to the base 302 by a first pair of torsional flexures 310, and an inner part 306 attached to the outer frame 304 by a second pair of torsional flexures 308. The first pair of torsional flexures 310 allows the outer frame 304 to rotate about a first axis 326 that is substantially parallel to a plane containing the base 302 and the outer frame 304. The second pair of torsional flexures 308 allows the inner part 306 to rotate about a second axis 324 that is substantially parallel to a plane containing the outer frame 304 and the inner part 306. The first axis 326 may be substantially perpendicular to the second axis 324. The base 302, the outer frame 304, and the inner part 306 may be coplanar, however this need not be the case. The inner part 306 may include a reflective surface such as a mirror. The torsional flexures 308 and 310 may be replaced by a combination of cantilever-like flexures, serpentine flexures, and pin-and staple type hinges.

The scanner 300 includes two vertical electrostatic comb-structures. For example a set of movable comb fingers 318 may be attached to the inner part 306 and an interdigitating set of fixed comb fingers 316 may be attached to the outer frame 304. Fixed comb fingers 316 are fixed relative to the outer frame 304 but can move relative to the base 302 by virtue of the outer frame 304 moving relative to the base 302. Alternatively, the comb structure may include a set of movable comb fingers 314 attached to the outer frame 304 that interdigitate with a set of fixed comb fingers 312 may be attached to the base 302. The comb fingers 312, 314, 316, 318 may be of the type shown in FIGS. 2A–B. Either or both of the comb structures defined by the comb fingers 312, 314, 316, 318 may be used as comb-drive actuators. In this example, applying a voltage $V_x$ from a source 320 between the movable comb fingers 318 and the fixed comb fingers 316 attracts the movable comb fingers 318 to the fixed comb fingers 316, which exerts a torque on the inner part 306 and causes the inner part 306 to rotate about a second axis 324. In a similar fashion, applying another voltage $V_y$ from another source 322 between the movable comb fingers 314 and the fixed comb fingers 312 attracts the movable comb fingers 314 to the fixed comb fingers 312, which exerts a torque on the outer frame 304 and causes the outer frame 304 to rotate about the first axis 326. The inner part 306 may rotate about the first axis 326 along with the outer frame. The applied voltages $V_x$ and $V_y$ from the sources 320 and 322 may be adjusted to independently control the angle between the outer frame 304 and the base 302, and the angle between the inner part 306 and the outer frame 304.

Furthermore, either or both of the comb structures defined by the comb fingers 312, 314, 316, 318 may be used as sensors to measure an angle of rotation. For example, the capacitance between the fixed and movable comb fingers can generally be measured to monitor the angular positions of the inner part 306 and the outer frame 304 since the capacitance of the comb fingers 316 and 318, or 312 and 314 depend on the degree to which they are engaged. Therefore, capacitance across the comb fingers 316 and 318, or 312 and 314 may be used to sense the angular position of the inner part 306 with respect to the outer frame 304 and the angular position of the outer frame 304 with respect to the base 302. For example capacitance sensors 332 and 334 may be electrically coupled to the comb fingers 312 and 316 respectively. The capacitive position monitoring signals from the sensors 332, 334 may be used to implement closed-loop feedback control on the angles of the inner part 306 and the outer frame 304 via the controllers 336, 338. The controllers 336, 338 may be used to implement a servo loop for active control of the angle of the outer frame 304 and the inner part 306.

In the example described above, the comb-drive structures including of comb-finger pairs 312 and 314 or 316 and 318 are used both as actuators and sensors. Alternately, either or both of the comb-drive structures may be used as actuators only or as sensors only.

Figure 1:
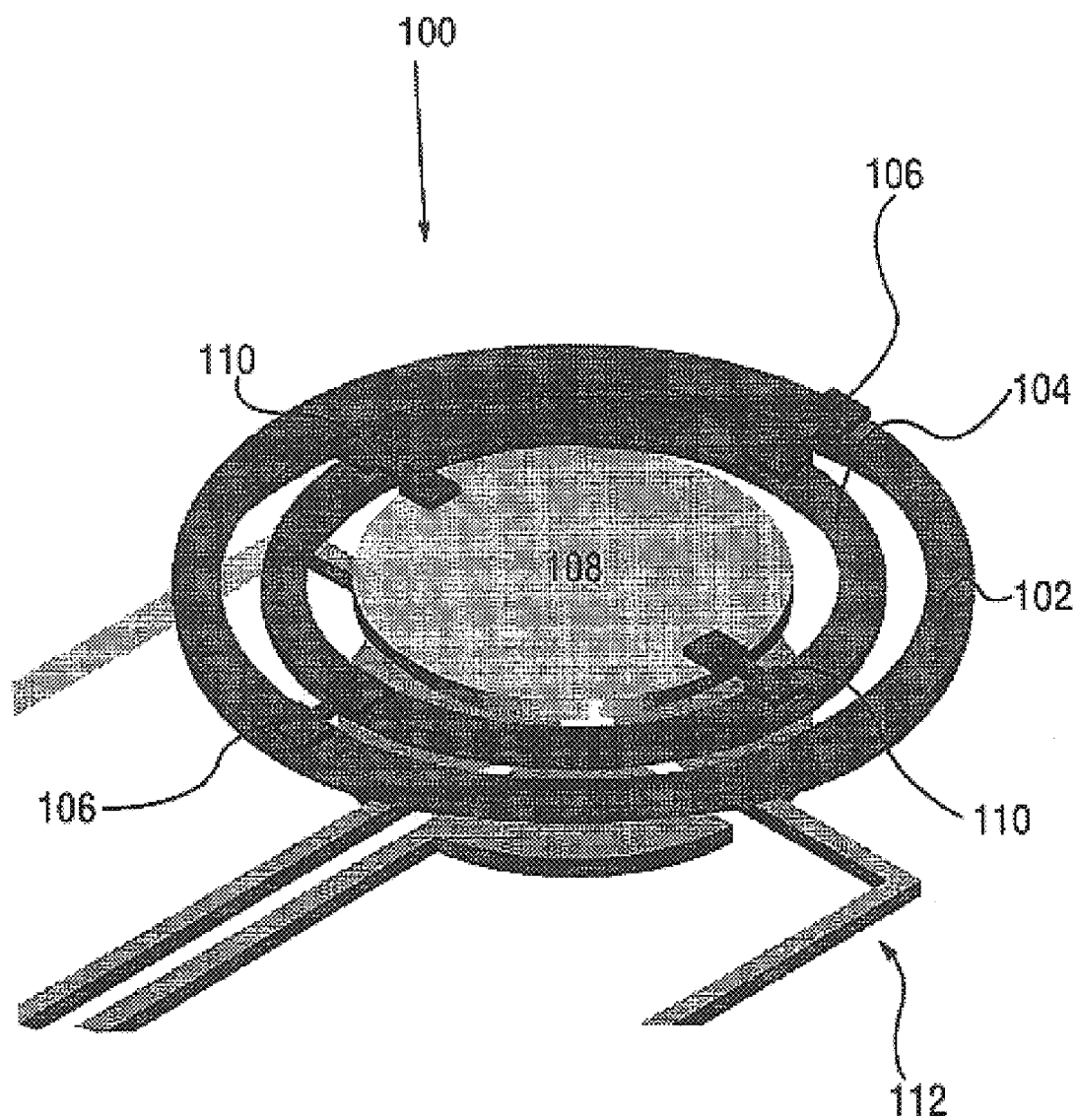
FIG. 1 is the view of a gimbaled electrostatic-gap actuator of the prior art.
Figure 2A:
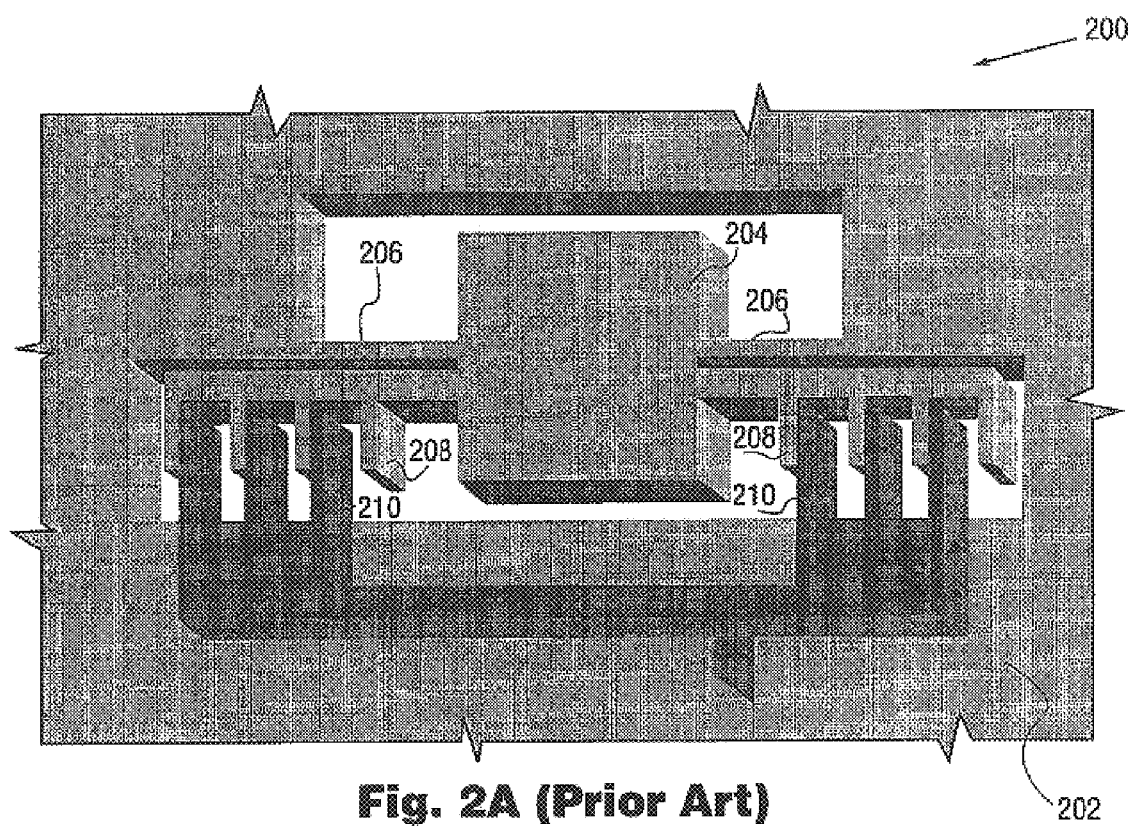
FIG. 2A is a plan view of one-dimensional vertical comb-drive actuator without any applied bias voltage of the prior art.
Figure 2B:
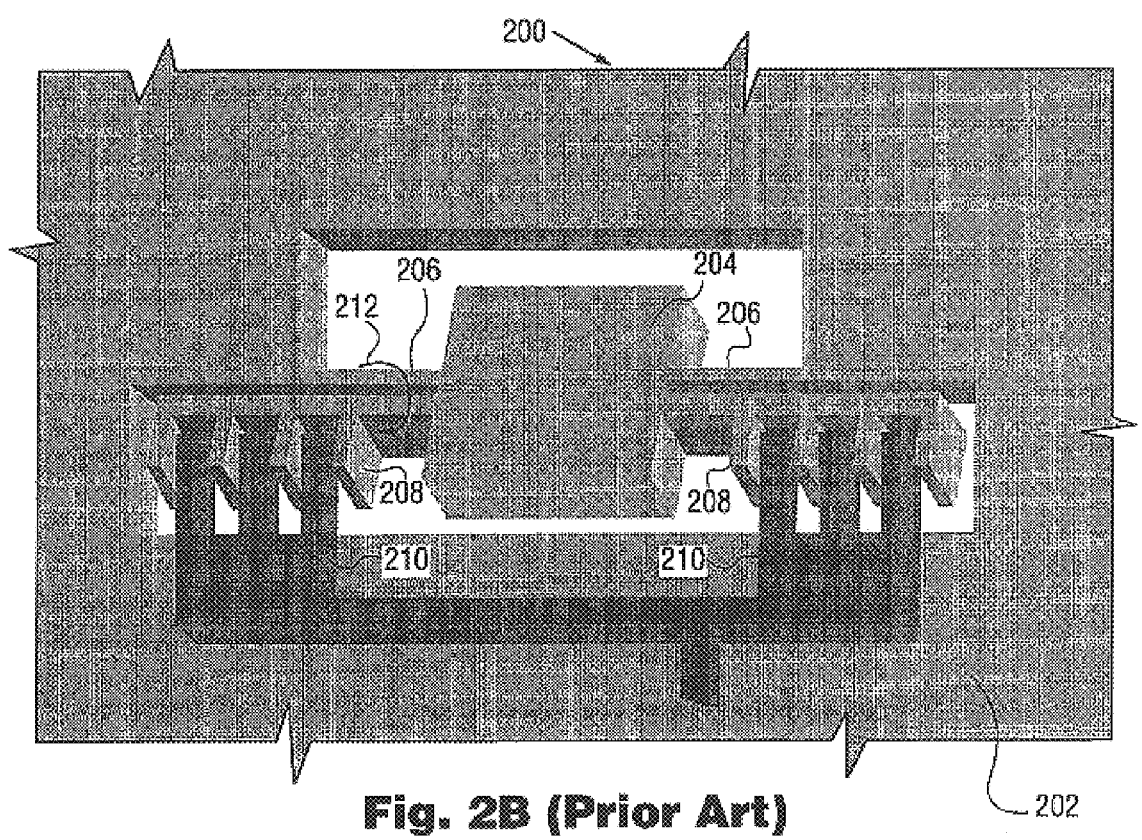
FIG. 2B is a plan view of one-dimensional vertical comb-drive actuator illustrated in FIG. 2A with applied bias of the prior art.

If any or all of the comb fingers 312, 314, 316, 318 are used as sensors, the scanner 300 may include alternative means for actuating the inner part 306 and/or the outer frame 304. Such means may include, but are not limited to gap-closing electrodes, piezo drives, magnetic drives, or a second set of comb-drives. Magnetic drives include use of a magnetic material on the moving part of the actuator along with an apparatus that provides a variable magnetic field. Magnetic drives further include use of a current-carrying element (e.g. a coil) on the moving part of the actuator along with an apparatus that provides an external magnetic field. In the case that any of the comb fingers 312, 314, 316, 318 are used only as sensors, these comb fingers may either be fabricated so that the pairs of opposing comb fingers 312 and 314, or 316 and 318 are vertically offset in their rest position (as shown in FIG. 2A), or they may be fabricated so that the pairs of opposing comb fingers are substantially engaged or interdigitated in their rest position, as occurs when the fingers are fabricated from a single layer.

If any or all of the comb fingers 312, 314, 316, 318 are used as comb-drive actuators, the scanner 300 may include alternative means for sensing the position of the inner part 306 and/or the outer frame 304. Such means may include, but are not limited to gap-closing electrodes, piezo-resistive sensors, or a second set of comb-drives that are used for sensing only. The second set of comb fingers may either be fabricated so that the pairs of opposing comb fingers 312 and 314, or 316 and 318 are vertically offset in their rest position (as shown in FIG. 2A), or they may be fabricated so that the pairs of opposing comb fingers are substantially engaged or interdigitated in their rest position, as occurs when the fingers are fabricated from a single layer.

All components of two-dimensional scanner 300 are typically made of silicon, silicon nitride, silicon oxide, silicon-germanium, nickel, chromium or gold. The two-dimensional scanner 300 may be fabricated using many different processes, including but not limited to a combination of Si surface-micromachining, Si-bulk micromachining, electroforming of high aspect-ratio features, HEXSIL, and LIGA. Vertical comb-drive actuators of two-dimensional scanner 300 may be fabricated using a semiconductor process disclosed in an article entitled "A Flat High-Frequency Scanning Micromirror" to Conant et al. issued by Hilton Head 2000 and incorporated herein by reference.

The fixed comb fingers 312 may be substantially co-planar with the movable comb fingers 314. Both sets of comb fingers 312, 314 may be fabricated in a single layer of a substrate as a self aligned comb structure. The design of the self-aligned comb structure containing the comb fingers 312, 314 may be such that in a nominal state the two sets of comb fingers substantially interdigitate according to a predetermined engagement. A biasing element (e.g., a magnetic material) may be attached to the outer frame 304. When subject to an external biasing force (e.g., due to a magnetic field), the biasing element causes the outer frame along with the movable comb fingers 314 to undergo an angular displacement from the initial engagement with respect to the base 302. A voltage between the stationary comb fingers 312 and the movable comb fingers 314 may then cause the movable comb fingers 314 along with the outer frame 304 to rotate back toward the initial engagement in a predetermined manner. In a like fashion, the fixed comb fingers 316 may be substantially co-planar with the movable comb fingers 318 and fabricated from the same layer of material to form a self-aligned comb structure. An external biasing force may be applied to the inner part 306 to rotate it out of plane with respect to the outer frame 304. Other implementations may employ an elastic force or an electrostatic force provided by gap-closing actuators to provide the biasing force. One-dimensional actuators may be constructed with comb drives of this type. These actuators provide the advantage of a single-layer comb-drive structure that is used for both actuation and sensing.

Figure 4:
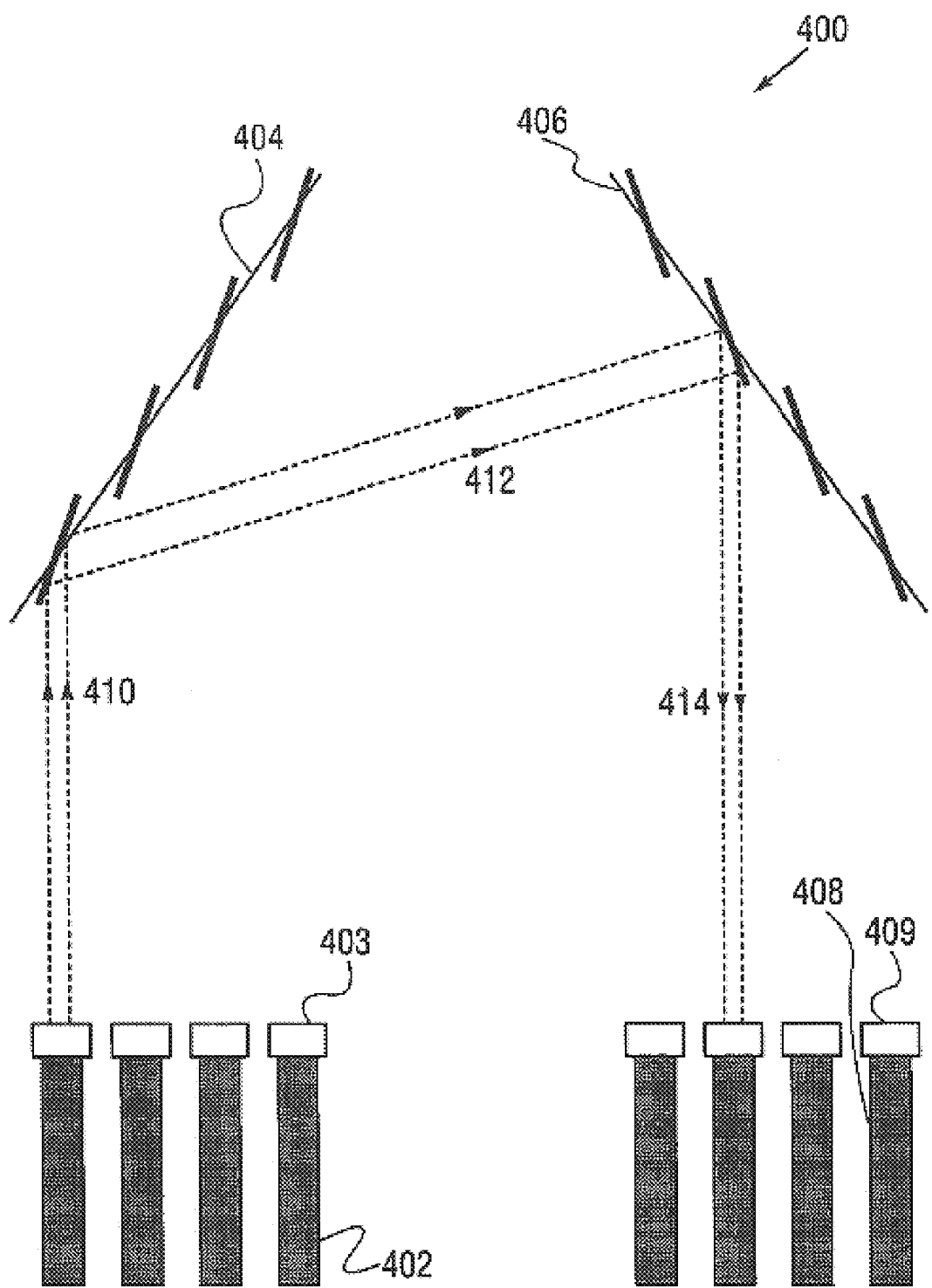
FIG. 4 depicts a fiber-optic switch containing gimbaled two-dimensional scanners.

Two-dimensional scanners having features in common with the two-dimensional scanners described in above embodiment may be used to produce fiber-optic switches that switch light between optical fibers. A fiber-optic switch may include one or more mirror arrays, and each array may contain one or more two-dimensional scanners. In FIG. 4, only two mirror arrays are shown for the sake of simplicity. Furthermore, the arrays are shown as linear arrays (e.g. a 1×4 array of mirrors), whereas they may be two-dimensional (e.g. a 4×4 array of mirrors) in a practical application. As shown in FIG. 4, a fiber-optic switch 400 includes an array of input fibers 402 terminated with microlenses 403 and a first array of scanning mirrors 404 positioned such that the first arrays 404 intercept beams 410 emerging from the array of input fibers 402 and microlenses 403. The first array of scanning mirrors 404 allows the beams 412, which emerge from this array of scanning mirrors, to be steered individually. The fiber-optic switch 400 also includes a second array of scanning mirrors 406 positioned such that the second array of scanning mirrors 406 intercept beams 412 emerging from the first array of scanning mirrors 404. The second array of scanning mirror 406 allows beams 414, which emerge from this second array of scanning mirrors, to be steered individually. The fiber-optic switch 400 further includes an array of output fibers 408 terminated with microlenses 409 for coupling the beams 414 emerging from the second array of scanning mirrors 406. Alternatively, large arrays of two-dimensional scanners may be used to produce large port-count fiber-optic switches. The first and/or second scanning mirror arrays contain mirrors mounted to two-dimensional scanners of the type shown and described with respect to FIG. 3.

Furthermore, two-dimensional scanners described in the preferred embodiment have a broad range of uses including biomedical device applications, and optical devices for tracking, display, and telecommunication applications. For example, such a two-dimensional scanner may be employed to scan a modulated laser beam in order to project an image onto a screen to produce a display.

Two-dimensional MEMS scanners of the type described above may be fabricated using conventional semiconductor processing steps, such as photolithographic, deposition, and isotropic and anisotropic etching techniques. When fabricating the comb structures, it is desirable to electrically insulate the fixed comb structures, e.g. 312, 316 from the corresponding movable comb structures, e.g. 314, 318, in order to be able to apply a voltage between them. This typically involves the fabrication of a suspended structure with portions that are mechanically attached but electrically insulated. Such structures may be fabricated using methods set forth in U.S. patent application Ser. No. 09/712,420.

A process for fabricating a suspended gimbaled structure with multi-layer comb-drives that are mechanically coupled but electrically isolated is shown in FIGS. 5A–5H. FIGS. 5A–5H show a sequence of simplified schematic cross-sections representing the process described below.

Figure 5A:
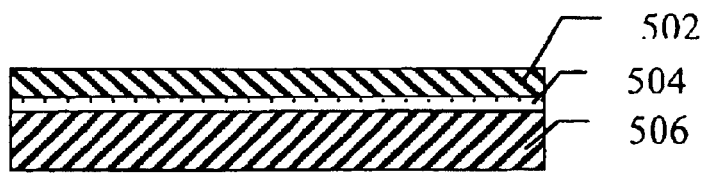
FIGS. 5A–5H depict cross-sectional schematic diagrams illustrating fabrication of a comb-drive structure according to an embodiment of the present invention.
Figure 5B:
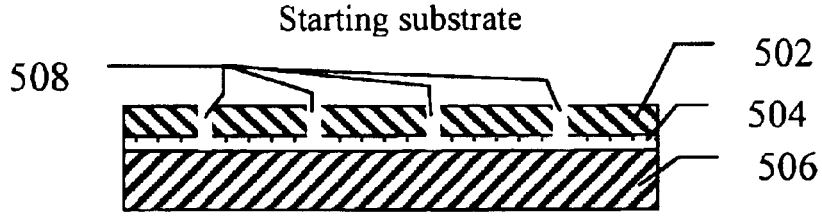
Figure 5C:
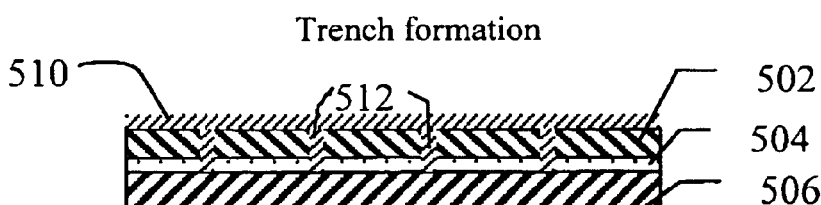

In FIG. 5A, the process starts with a substrate 501 having a device layer 502 disposed on an intermediate layer 504, which is disposed on a substrate layer 506. Preferably, the device layer 502 and intermediate layer 504 are composed of different materials, such that the intermediate layer 504 may act as an etch-stop for etching of the device layer 502. For example, the substrate may be a silicon-on-insulator (SOI) wafer, which is composed of a Si device layer 502, a silicon-oxide intermediate layer 504, and a silicon substrate layer 506. The device layer 502 may alternatively be the substrate itself, or a layer of device material such as silicon or silicon-oxide deposited on top of a substrate. In that case, the substrate is preferably composed of a material other than that of the device layer, such that it may act as an etch-stop.

The device layer 502 is patterned to define one or more features, e.g. using a standard photoresist. The features are then etched to form one or more narrow trenches 508 in the device layer 502, as shown in FIG. 5A. The trenches 508 may penetrate into the intermediate layer 504 and/or the substrate layer 506. The trenches 508 are then completely filled with an etch-stop material 510 to form one or more filled trenches 512. The etch-stop material may also be deposited on top of the device layer 502. Suitable etch-stop materials include silicon nitride, polycrystalline silicon, silicon dioxide, tungsten, etc. or a combination of the above, depending on the composition of the device layer. The etch-stop material is typically deposited using chemical vapor deposition. Alternatively, sputtering or electroplating may be used to deposit the etch-stop material 510. The etch-stop material completely fills the trenches 508, forming the filled trenches 512. The etch-stop material 510 may be also deposited over a surface of the device layer 502, which would typically happen in the same deposition step. Alternatively, a separate deposition may be required for this.

In the example where SOI is used as the starting material, the trenches 508 are etched using deep-Si etching techniques, and filled with CVD oxide (e.g. TEOS) or thermal oxide, which also coats the surface of the device layer. Proper design of the pattern of filled trenches 512 creates portions of device layer material that are enclosed by the material in the filled trenches on the sides, the material of the intermediate layer on the bottom surface, and the material deposited during the trench-fill process on the top surface of the device layer.

At this point the surface of the device layer 502 is largely planar and any further processing may be performed using standard semiconductor processes. Also, since the etch-stop material may be deposited at high temperature, further high-temperature processing is not prevented.

Figure 5D:
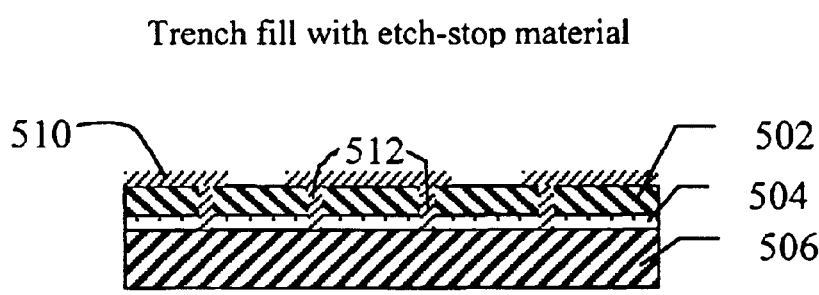

Selected portions of the etch-stop material 510 are removed to expose selected portions of the device layer 502, as shown in FIG. 5D. Structural features 522, such as comb fingers, are then formed on the exposed portions of the device layer 502. Alternatively, the structural features 522 may also be formed directly on top of the etch-stop material 510. The structural features 522 are typically made of a material that is different from the etch-stop material 510. Alternatively, the features 522 may be formed from the same material, but in a later deposition step. The structural features 522 may be formed from a patterned structural layer containing multiple sub-layers of material. The structural features 522 are secured to the device layer 502 at some point or points outside the plane of the drawing in FIGS. 5A–5H.

Since, preferably, different parts of the gimbaled comb-structure are insulated from each other, it is important that the structural features 522 can be connected to the device layer 502 with both an insulating and a conductive contact. There are several ways to achieve both insulating and conductive contacts between the structural features 522 and the device layer 502. For example, an insulating layer, such as silicon-nitride, may be deposited and patterned on the surface of the device layer 502 before any processing is done (FIG. 5A). Contacts between the structural layer, i.e. the layer containing the structural features 522, and the device layer 502 can be made conductive or insulating by patterning the insulating layer so that it remains or does not remain on the contact area. Alternatively, an insulating layer may be deposited and patterned after the selective exposure of the device layer material (FIG. 5D), so that subsequently deposited structural features 522 make contact either directly to the device layer 502 or to the insulating layer deposited on top of the device layer.

Figure 5E:
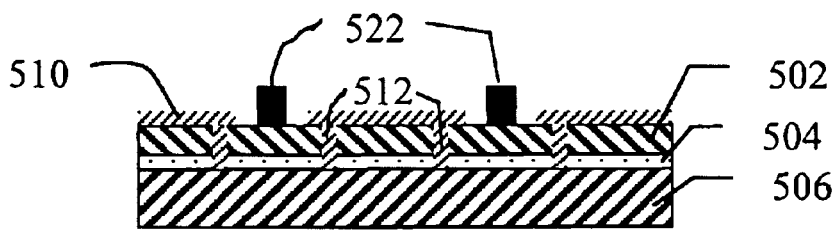
Figure 5F:
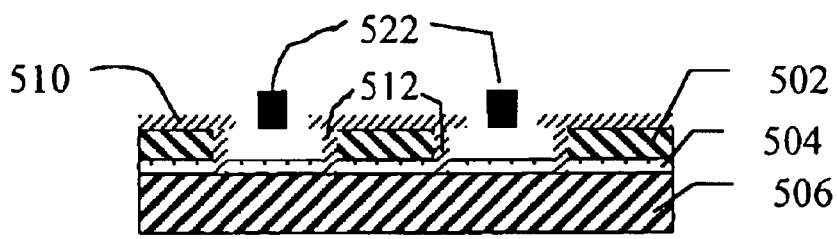

Once all processing of the structural features 522 has been performed, the etch-stop layer can be patterned to expose the device layer in appropriate places as shown in FIG. 5E. Alternately, a photoresist layer may be deposited and patterned in order to expose the device layer in the appropriate places. Next, an isotropic etch of the device layer is performed as shown in FIG. 5F. The isotropic etch may be a wet etch process or dry etch process or some combination of both. The isotropic etch removes exposed portions of the device layer 502 material but not the etch-stop material 510, the structural features 522, or portions of the device layer that are protected by the etch-stop material 510, structural features 522, or photoresist layer. The isotropic etch undercuts and releases the structural features 522 that were on top of the device layer 502. The etch process is contained by the etch-stop material 510 in the filled trenches 512, thereby controlling the width of the undercut. The cavity created underneath the structural features 522 allows the top combs (formed in the structural layer) to swing down and interdigitate with the bottom combs (formed in the device layer).

Figure 5G:
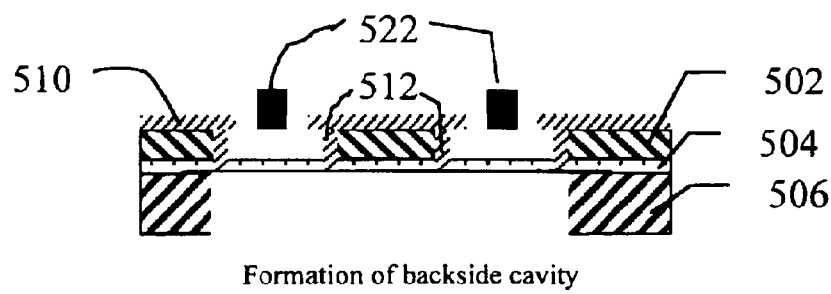
Figure 5H:
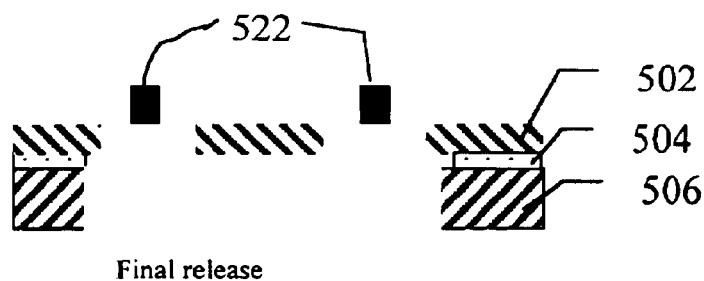

At this point, the comb-fingers have been formed, and the gimbal structure may be released so that it can rotate freely. The first part of the release involves creation of a cavity in the substrate layer 506, as shown in FIG. 5G. The cavity can be formed by patterning and etching the substrate layer from the backside. As shown in FIG. 5H, the final step in this process is a timed etch of the intermediate layer and the trench-fill layer (if necessitated by the design) in order to release the structures and allow them to move. The final device consists of a suspended gimbaled structure with multi-layer comb-drives and portions that are mechanically coupled but electrically isolated.

Other methods exist for fabricating two-dimensional gimbaled structures with comb-drives. For example, where the comb structures are to be vertically offset from each other in their rest position, as shown in FIG. 2A, the stationary and moving comb structures may be simultaneously fabricated from a single substrate using a self aligned technique as described in cross-referenced application 60/192,097. The self-aligned fabrication method typically involves the steps of providing a multi-layer structure having first and second conductive layers separated by an insulating layer, and etching a top pattern in the first and second conductive layers and insulating layer to define the moving and stationary comb fingers. The substrate may also have additional layers that are etched to define the bottom surfaces of the fingers. Because the fingers are fabricated together, the difficult alignment of the moving and stationary fingers, required for fabricating conventional vertical comb-drive actuators, may be avoided. Alignment is a direct result of the mask used in fabrication. Electrical conduction between the different layers in this structure may be achieved by etching narrow trenches vertically through multiple layers and filling the trenches with electrically conductive material.

In structures where the fixed and moving combs interdigitate in their rest positions, both the moving and fixed comb fingers may be fabricated in the same step from the same layer of device material by a single patterning and etching step. It is important to insulate the comb drives from each other so that they can support a voltage difference and therefore be used for sensing and/or actuating. This can be achieved by etching narrow trenches in the layer from which the comb-fingers and the gimbaled structure has been fabricated, and filling these trenches with insulating material. The insulating material mechanically attaches the structural material on either side of the trench, while keeping them electrically isolated.

It will be clear to one skilled in the art that the above embodiment may be altered in many ways without departing from the scope of the invention.

What is claimed is:

1. A two-dimensional scanner comprising:
   a) a base;
   b) an outer frame rotatably attached to the base for rotation about a first axis substantially parallel to a plane containing the outer frame and/or the base;
   c) an inner part rotatably attached to the outer frame for rotation about a second axis substantially parallel to a plane containing the inner part and/or the outer frame;
   d) a first set of comb fingers attached to the outer frame; and
   e) a second set of comb fingers attached to the base, wherein the first and second sets of comb fingers interdigitate in a substantially co-planar fashion at some rotation of the outer frame relative to the base about the first axis.

2. The scanner of claim 1, further comprising means for applying a voltage between the first and second set of comb fingers, whereby the comb fingers may act as a comb-drive actuator.

3. The scanner of claim 2, further comprising means for applying a constant biasing force between the outer frame and the base.

4. The scanner of claim 2, further comprising means for sensing an angular position of the outer frame relative to the base.

5. The scanner of claim 4, wherein the means for sensing angular position are chosen from the group consisting of gap-closing electrodes and piezoresistive sensors.

6. The scanner of claim 4, wherein the means for sensing angular position comprises a capacitance sensor electrically coupled between the first and second sets of comb fingers, whereby the comb fingers may act as both a comb-drive actuator and a sensor.

7. The scanner of claim 1, further comprising means for sensing an angular position of the outer frame relative to the base.

8. The scanner of claim 7, wherein the means for sensing angular position includes a capacitance sensor electrically coupled between the first and second sets of comb fingers.

9. The scanner of claim 7, further comprising drive means for rotating the outer frame relative to the base.

10. The scanner of claim 9, wherein the drive means is chosen from the group consisting of gap-closing electrodes, magnetic drives, and piezo drives.

11. The scanner of claim 1, further comprising:
   e) a third set of comb fingers attached to the inner part; and
   f) a fourth set of comb fingers attached to the outer frame, wherein the third and fourth sets of comb fingers interdigitate at some rotation of the inner part relative to the outer frame about the second axis.

12. The scanner of claim 11, further comprising:
   g) means for applying a voltage between the first and second sets of comb fingers, whereby the first and second sets of comb fingers may act as a comb-drive actuator; and
   h) means for applying a voltage between the third and fourth sets of comb fingers, whereby the third and fourth sets of comb fingers may act as a comb-drive actuator.

13. The scanner of claim 12, further comprising:
   g') means for measuring a capacitance between the first and second sets of comb fingers, whereby the first and second sets of comb fingers may act as both a comb-drive actuator and a position sensor; and
   h') means for measuring a capacitance between the third and fourth sets of comb fingers, whereby the third and fourth sets of comb fingers may act as both a comb-drive actuator and a position sensor.

14. The scanner of claim 12, further comprising:
   g") means for measuring a capacitance between the first and second sets of comb fingers, whereby the first and second sets of comb fingers may act as a position sensor; and
   h") means for measuring a capacitance between the third and fourth sets of comb fingers, whereby the third and fourth sets of comb fingers may act as a position sensor.

15. The scanner of claim 14, further comprising drive means for rotating the inner part relative to the outer frame.

16. The scanner of claim 15, wherein the drive means is chosen from the group consisting of gap-closing electrodes, magnetic drives, and piezo drives.

17. The scanner of claim 14, further comprising drive means for rotating the outer frame relative to the base.

18. The scanner of claim 17, wherein the drive means is chosen from the group consisting of gap-closing electrodes, magnetic drives, and piezo drives.

19. The scanner of claim 1, wherein the outer frame is rotatably attached to the base by means selected from the group consisting of torsional flexures, cantilever-like flexures, serpentine flexures, and pin-and-staple type hinges.

20. The scanner of claim 19, wherein the torsional flexures have cross-sections selected from the group consisting of rectangular cross-section, I-shaped cross-section, and T-shaped cross-section.

21. The scanner of claim 1, wherein the inner part is rotatably attached to the outer frame by means selected from the group consisting of torsional flexures, cantilever-like flexures, serpentine flexures, and pin-and-staple type hinges.

22. The scanner of claim 21, wherein the torsional flexures have cross-section selected from the group consisting of rectangular cross-section, I-shaped cross-section, and T-shaped cross-section.

23. A two-dimensional scanner comprising:
   a) a base;
   b) an outer frame rotatably attached to the base for rotation about a first axis substantially parallel to a plane containing the outer frame and/or the base;
   c) an inner part rotatably attached to the outer frame for rotation about a second axis substantially parallel to a plane containing the outer frame and/or the base;
   d) a first set of comb fingers attached to the inner part; and
   e) a second set of comb fingers attached to the outer frame, wherein the first and second sets of comb fingers interdigitate in a substantially co-planar fashion at some rotation of the inner part relative to the outer frame about the second axis.

24. The scanner of claim 23, further comprising means for applying a voltage between the first and second set of comb fingers, whereby the comb fingers may act as a comb-drive actuator.

25. The scanner of claim 24, further comprising means for applying a constant biasing force between the inner part and the outer frame.

26. The scanner of claim 24, further comprising means for sensing an angular position of the inner part relative to the outer frame.

27. The scanner of claim 26, wherein the means for sensing angular position are chosen from the group consisting of gap-closing electrodes and piezoresistive sensors.

28. The scanner of claim 26, wherein the means for measuring angular position comprises a capacitance sensor electrically coupled between the first and second sets of comb fingers, whereby the comb fingers may act as both a comb-drive actuator and a sensor.

29. The scanner of claim 23, further comprising means for sensing an angular position of the inner part relative to the outer frame.

30. The scanner of claim 29, wherein the means for sensing angular position includes a capacitance sensor electrically coupled between the first and second sets of comb fingers.

31. The scanner of claim 29, further comprising drive means for rotating the outer frame relative to the base.

32. The scanner of claim 31, wherein the drive means is chosen from the group consisting of gap-closing electrodes, magnetic drives, and piezo drives.

33. The scanner of claim 23, wherein the outer frame is rotatably attached to the base by means selected from the group consisting of torsional flexures, cantilever-like flexures, serpentine flexures, and pin-and-staple type hinges.

34. The scanner of claim 33, wherein the torsional flexures have cross-sections selected from the group consisting of rectangular cross-section, I-shaped cross-section, and T-shaped cross-section.

35. The scanner of claim 23, wherein the inner part is rotatably attached to the outer frame by means selected from the group consisting of torsional flexures, cantilever-like flexures, serpentine flexures, and pin-and-staple type hinges.

36. The scanner of claim 35, wherein the torsional flexures have cross-section selected from the group consisting of rectangular cross-section, I-shaped cross-section, and T-shaped cross-section.

37. A fiber-optic switch comprising:
   a) an array of input optical fibers;
   b) one or more arrays of mirrors for deflecting light from one or more input optical fibers, wherein one or more mirrors in the one or more arrays includes a two-dimensional scanner; and
   c) an array of output optical fibers for coupling light emerging from the one or more arrays of mirrors;
   wherein the two-dimensional scanner comprises:
      i) a base;
      ii) an outer frame rotatably attached to the base for rotation about a first axis substantially parallel to a plane containing the outer frame and/or the base;
      iii) an inner part rotatably attached to the outer frame for rotation about a second axis substantially parallel to a plane containing the outer frame and/or the base;
      iv) a first set of comb fingers attached to the outer frame; and
      v) a second set of comb fingers attached to the base, wherein the first and second sets of comb fingers interdigitate in a substantially co-planar fashion at some rotation of the outer frame relative to the base about the first axis.

38. The switch of claim 37, wherein the one or more arrays of mirrors individually steer light from the input optical fibers to the output optical fibers.

39. The switch of claim 37, wherein the input optical fibers and output optical fibers are terminated with microlenses.

40. The switch of claim 37, wherein the inner part includes a mirror.

41. The switch of claim 37, further comprising means for applying a voltage between the first and second set of comb fingers, whereby the first and second sets of comb fingers may act as a comb-drive actuator.

42. The switch of claim 37, further comprising means for sensing a capacitance between the first and second comb fingers, whereby the first and second sets of comb fingers may act as a position sensor for sensing an angular position of the outer frame relative to the base.

43. The switch of claim 42, further comprising means for applying a voltage between the first and second set of comb fingers, whereby the first and second sets of comb fingers may act as both a comb-drive actuator and an angular position sensor.

44. The optical switch of claim 37, further comprising:
   e) a third set of comb fingers attached to the inner part; and
   f) a fourth set of comb fingers attached to the outer frame, wherein the third and fourth sets of comb fingers interdigitate at some rotation of the inner part relative to the outer frame about the second axis.

45. An optical switch, comprising:
   a) an array of input optical fibers;
   b) one or more arrays of mirrors for deflecting light from one or more input optical fibers, wherein one or more mirrors in the one or more arrays includes a two-dimensional scanner; and
   c) an array of output optical fibers for coupling light emerging from the one or more arrays of mirrors;
   wherein the two-dimensional scanner comprises:
      i) a base;
      ii) an outer frame rotatably attached to the base for rotation about a first axis substantially parallel to a plane containing the outer frame and/or the base;

iii) an inner part rotatably attached to the outer frame for rotation about a second axis substantially parallel to a plane containing the outer frame and/or the base;

iv) a first set of comb fingers attached to the inner part; and v) a second set of comb fingers attached to outer frame, wherein the first and second sets of comb fingers interdigitate in a substantially co-planar fashion at some rotation of the inner part relative to the outer frame about the second axis.

46. The switch of claim 45, wherein the one or more arrays of mirrors individually steer light from the input optical fibers to the output optical fibers.

47. The switch of claim 45, wherein the input optical fibers and output optical fibers are terminated with microlenses.

48. The switch of claim 45, wherein the inner part includes a mirror.

49. The switch of claim 45, further comprising means for applying a voltage between the first and second set of comb fingers, whereby the first and second sets of comb fingers may act as a comb-drive actuator.

50. The switch of claim 45, further comprising means for sensing a capacitance between the first and second comb fingers, whereby the first and second sets of comb fingers may act as a position sensor for sensing an angular position of the outer frame relative to the base.

51. The switch of claim 50, further comprising means for applying a voltage between the first and second set of comb fingers, whereby the first and second sets of comb fingers may act as both a comb drive actuator and an angular position sensor.

* * * * *